(12) United States Patent
Murray (10) Patent No.: US 10,593,776 B2
(45) Date of Patent: *Mar. 17, 2020

(54) DIELECTRIC ELECTRODE ASSEMBLY AND METHOD OF MANUFACTURE THEREOF

(71) Applicant: Auroma Technologies, Co., LLC, Everett, WA (US)

(72) Inventor: Michael W. Murray, Mukilteo, WA (US)

(73) Assignee: AUROMA TECHNOLOGIES, CO., LLC., Everett, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/175,415

(22) Filed: Oct. 30, 2018

(65) Prior Publication Data
US 2019/0067438 A1 Feb. 28, 2019

Related U.S. Application Data

(63) Continuation-in-part of application No. 15/147,852, filed on May 5, 2016, now Pat. No. 10,333,268.

(51) Int. Cl.
*H01S 3/0975* (2006.01)
*H01L 29/49* (2006.01)
(Continued)

(52) U.S. Cl.
CPC .......... *H01L 29/49* (2013.01); *H01L 21/0425* (2013.01); *H01S 3/0975* (2013.01);
(Continued)

(58) Field of Classification Search
CPC .... H01S 3/09702; H01S 3/038; H01S 3/0385; H01S 3/0402; H01S 3/0404;
(Continued)

(56) References Cited

U.S. PATENT DOCUMENTS 3,648,119 A 3/1972 Van Eeck
4,261,806 A 4/1981 Asai et al.
(Continued)

FOREIGN PATENT DOCUMENTS

GB 2163896 3/1986
JP 60-157277 A 8/1985
(Continued)

OTHER PUBLICATIONS

Machine translation of JP62-183580A downloaded from Japan Platform for Patent Information Website Aug. 14, 2017; 6 pgs.
(Continued)

*Primary Examiner* — Tod T Van Roy
*Assistant Examiner* — Delma R. Fordé
(74) *Attorney, Agent, or Firm* — K&L Gates LLP (57) ABSTRACT

A dielectric electrode assembly, and a method (600) of manufacture thereof, including: a dielectric tube (226) having a cylindrical cross-section and a relative dielectric constant, $\varepsilon_2$, the dielectric tube (226) filled with a gas having a relative dielectric constant, $\varepsilon_1$; a structural dielectric (225) having a relative dielectric constant, $\varepsilon_3$ surrounding the dielectric tube (226); metal electrodes (224) on opposite sides of the structural dielectric (225), the metal electrodes (224) having a flat cross-sectional geometry; and the structural dielectric (225) made from a material selected such that the relative dielectric constants of the structural dielectric (225), the dielectric tube (226), and the gas are interrelated and an approximately uniform electric field is generated within the dielectric tube (226) when power is applied to the metal electrodes (224).

20 Claims, 6 Drawing Sheets

(51) Int. Cl.
*H01L 21/04* (2006.01)
*H01S 5/042* (2006.01)
*H01S 3/038* (2006.01)
*H01S 3/041* (2006.01)
*H01S 3/04* (2006.01)

(52) U.S. Cl.
CPC .......... *H01S 5/0425* (2013.01); *H01S 3/0385* (2013.01); *H01S 3/041* (2013.01); *H01S 3/0407* (2013.01)

(58) Field of Classification Search
CPC .......... H01S 3/0407; H01S 3/041; H01S 3/03; H01S 3/0305; H01S 3/032; H01S 3/04; H01S 3/061; H01S 3/0401; H01S 3/097; H01S 3/09707; H01S 3/22; H01S 3/223; H01S 3/0323; H01S 3/036; H01S 3/06; H01S 3/0606; H01S 3/0615; H01S 3/0931; H01S 3/0941; H01S 3/034; H01S 3/031; H01S 3/0387; H01S 3/0388; H01S 3/0604; H01S 3/134; H01S 3/104; H01S 1/06; H01S 5/30; H01S 5/0425; H01J 17/00; H01J 17/22
See application file for complete search history.

(56) References Cited

U.S. PATENT DOCUMENTS

| | | | |
|---|---|---|---|
| 4,596,018 | A | 6/1986 | Gruber et al. |
| 4,785,458 | A | 11/1988 | Kuzumoto et al. |
| 4,796,271 | A | 1/1989 | Christensen, Jr. et al. |
| 4,885,754 | A | 12/1989 | Egawa |
| 4,960,570 | A | 10/1990 | Mechtersheimer |
| 5,062,116 | A | 10/1991 | Christensen |
| 5,136,606 | A | 8/1992 | Iehisa et al. |
| 5,172,389 | A | 12/1992 | Horiuchi et al. |
| 5,373,528 | A | 12/1994 | Kuzumoto et al. |
| 10,333,268 | B2 * | 6/2019 | Murray .................. H01L 29/49 372/38.05 |
| 2002/0061045 | A1 | 5/2002 | Zhang et al. |
| 2004/0218650 | A1 | 11/2004 | Monty |
| 2008/0245478 | A1 | 10/2008 | Hotta et al. |
| 2010/0086000 | A1 | 4/2010 | Zeller |
| 2014/0064318 | A1 | 3/2014 | Demaria et al. |

FOREIGN PATENT DOCUMENTS

| | | |
|---|---|---|
| JP | S61-295681 | 12/1986 |
| JP | 62-183580 A | 8/1987 |
| JP | 63-027077 A | 2/1988 |

OTHER PUBLICATIONS

Machine translation of JP63-027077A downloaded from Japan Platform for Patent Information Website Aug. 14, 2017; 5 pgs.
Machine translation of JP60-157277A downloaded from Japan Platform for Patent Information Website Jul. 21, 2017; 4 pgs.
Author unknown; International Search Report and Written Opinion of PCT/US2017/029002; dated Jul. 14, 2017; 13 pgs.
Professional translation of JP60-157277A cited in International Search Report and Written Opinion of PCT/US2017/029002; dated Jul. 14, 2017; 5 pgs.
Author unknown; Translation of Notice of Reasons for Rejection of Japan Patent Application No. 2018-551764; Dec. 3, 2019; 3 pgs.
Machine translation of JP S61-295681 downloaded from Google Patents Dec. 17, 2019; 3 pgs.

* cited by examiner

DIELECTRIC ELECTRODE ASSEMBLY AND METHOD OF MANUFACTURE THEREOF

CROSS-REFERENCE TO RELATED APPLICATIONS

This application is a continuation-in-part of U.S. patent application Ser. No. 15/147,852 filed May 5, 2016, the disclosure of which is incorporated herein by reference in its entirety.

TECHNICAL FIELD

The present invention relates generally to a dielectric electrode assembly, and more particularly to a system for a dielectric electrode assembly with flat electrodes.

BACKGROUND ART

Uniform excitation of laser gas is of particular importance in the case of molecular gas lasers such as $CO_2$ and CO lasers where over pumping can lead to localized degradation of optical gain in the gas. In addition, electrically pumped gas lasers in general may suffer from instabilities that form under high pulse energy conditions. Electrical discharge instabilities may lead to intense arc discharges which may damage the laser electrodes or at the very least render the optical quality of the gas discharge gain medium useless for producing a high mode quality laser beam. Establishing very high initial gas discharge uniformity is of paramount importance for pulsed, high energy, gas lasers in order to increase the amount of energy that may be deposited into the gas before the inevitable onset of gas discharge instabilities.

Traditionally, gas lasers have been operated in continuous wave (cw) mode at low gas pressures (10 to 100 torr) or as pulsed lasers at high gas pressures (300 to 760 torr). At low gas pressures gas lasers typically have small transverse gas discharge dimensions (1 to 4 mm) to produce some degree of discharge uniformity by relying on high rates of ambipolar diffusion in the laser plasma. In addition, extra helium is added to the gas mixtures of low pressure gas lasers to improve discharge uniformity by further enhancing ambipolar diffusion. At high gas pressures, gas lasers usually have transverse discharge dimensions that are too large to allow ambipolar diffusion to be practical. High pressure gas lasers have traditionally used specially profiled electrodes to achieve very good uniform electric field conditions where the gas discharges occur.

Profiled electrodes typically utilize a central region with a flat, parallel, electrode geometry in conjunction with profiled electrode regions chosen to gradually reduce the electric field strength on both sides of the central region while introducing only a minimal amount of electric field distortion in the central region. The gas discharge in a profiled electrode assembly is usually confined to the central region and will have either a square or rectangular cross-section. Unfortunately, the lowest order optical mode of a laser will most likely have a cross-section that is either circular or elliptical and is not a good match for the discharge cross-section of a profiled electrode assembly. About 20% of the energy deposited into the gas discharge of the profiled electrode assembly will not be in the optical cavity of the laser and will be wasted.

Rather than flat electrodes which waste energy, curved electrodes can be used around a cylindrical cross-section. The resulting electric field will fill the optical mode cross-section but unfortunately will be non-uniform. At high gas pressure the RF current flowing through the laser gas of the curved electrode assembly will bunch up on both sides of the optical mode cross-section and largely bypass the gas in the center of the electrode assembly. The non-uniformity of the field will also reduce the efficiency of the laser assembly. It is known that if both the dielectric and the electrodes are carefully shaped, an electrode assembly that does produce a uniform gas discharge with a cross-section that does match the cross-section of the lowest order mode of a laser can be created. However, this process can be very complicated to manufacture.

Thus, a need still remains for a simpler fabrication method of an efficient laser electrode assembly. In view of the growing importance of energy-efficient high-power lasers, the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a dielectric electrode assembly that includes providing a dielectric tube having a cylindrical cross-section and a relative dielectric constant, $\varepsilon_2$, the dielectric tube filled with a gas having a relative dielectric constant, $\varepsilon_1$; surrounding the dielectric tube with a structural dielectric having a relative dielectric constant, $\varepsilon_3$; positioning metal electrodes on opposite sides of the structural dielectric, the metal electrodes having a flat cross-sectional geometry; and selecting a material for the structural dielectric such that the relative dielectric constants of the structural dielectric, the dielectric tube, and the gas are interrelated and a uniform electric field (or an electric field that is at least 90% uniform) is generated within the dielectric tube when power is applied to the metal electrodes.

The present invention provides a dielectric electrode assembly that includes a dielectric tube having a cylindrical cross-section and a relative dielectric constant, $\varepsilon_2$, the dielectric tube filled with a gas having a relative dielectric constant, $\varepsilon_1$; a structural dielectric having a relative dielectric constant, $\varepsilon_3$ surrounding the dielectric tube; metal electrodes on opposite sides of the structural dielectric, the metal electrodes having a flat cross-sectional geometry; and the structural dielectric made from a material selected such that the relative dielectric constants of the structural dielectric, the dielectric tube, and the gas are interrelated and a uniform electric field (or an electric field that is at least 90% uniform) is generated within the dielectric tube when power is applied to the metal electrodes.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the electrode, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Figure 1:
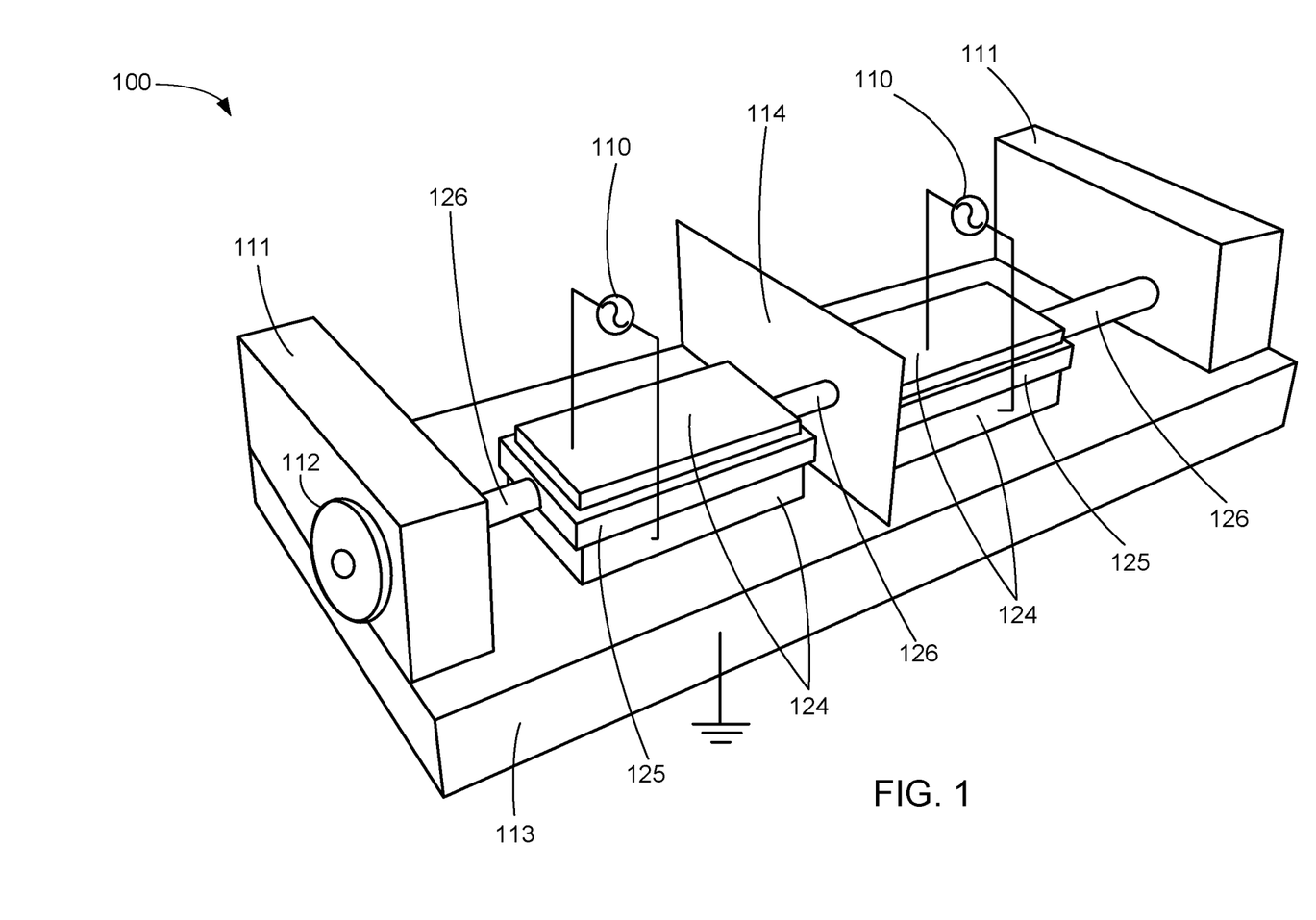
FIG. 1 is a perspective view of a laser assembly in a first embodiment of the present invention.

Referring now to FIG. 1, therein is shown a perspective view of a laser assembly 100 in a first embodiment of the present invention. The depicted laser assembly 100 may utilize two dielectric electrode assemblies which share a dielectric tube 126. For illustrative purposes, this figure only shows two dielectric electrode assemblies, but it is understood that any arbitrary number of dielectric electrode assemblies can be used. For example, three or more dielectric electrode assemblies can be used.

The dielectric electrode assemblies include metal electrodes 124 which may be disposed on opposite sides of a structural dielectric 125. The dielectric tube 126 can be considered a portion of the dielectric electrode assemblies. The metal electrodes 124 may be flat. The metal electrodes 124 may be shorter than the structural dielectric 125. The structural dielectric 125 may generally be longer than the metal electrodes 124 by a dimension of at least half the diameter of the dielectric tube 126 on each end of the dielectric electrode assembly. By extending the structural dielectric 125 beyond the ends of the metal electrodes 124 electric field distortion at the ends of the dielectric electrode assemblies may be minimized and the electrical breakdown path between the metal electrodes 124 may be extended. The structural dielectric may also be wider than the metal electrodes 124 to extend the electrical breakdown path between the metal electrodes 124 on each side of the dielectric electrode assemblies.

The dielectric electrode assemblies are energized by power sources 110 which can be time varying in nature. The power sources 110 may be radio frequency (RF) sine wave sources or may comprise square pulses with fast rising and/or falling edges, for example. One of the metal electrodes 124, adjacent to a frame 113 of the laser assembly 100, for one or both of the dielectric electrode assemblies, may be electrically connected to the frame 113 of the laser assembly 100. As another example, the metal electrodes 124 may be electrically isolated from the frame 113 of the laser assembly 100. Because it may be desirable to operate the power sources 110 independently, a metal partition 114 may be located between the dielectric electrode assemblies to act as an electrical shield. The metal partition 114 may have a small aperture just large enough to allow the dielectric tube 126 to pass through the metal partition 114 while keeping a minimum amount of electrical energy from coupling between dielectric electrode assemblies. The ends of the dielectric tube 126 are connected to laser mirror mounts 111 by gas tight seals. The laser mirror mounts 111 provide an unobstructed optical path between the ends of dielectric tube 126 and laser mirrors 112. Only one of the laser mirrors 112 is shown for clarity. The one of the laser mirrors 112 which is visible is oriented off-axis for visibility and clarity in the diagram, but it is understood that the laser mirrors 112 may be mounted to be perpendicular to the axis of the dielectric tube 126 on the face of the laser mirror mounts 111. The laser mirror mounts 111 may be mounted on the frame 113 of the laser assembly 100 to rigidly hold the laser mirrors 112 in a fixed position relative to each other.

Figure 2:
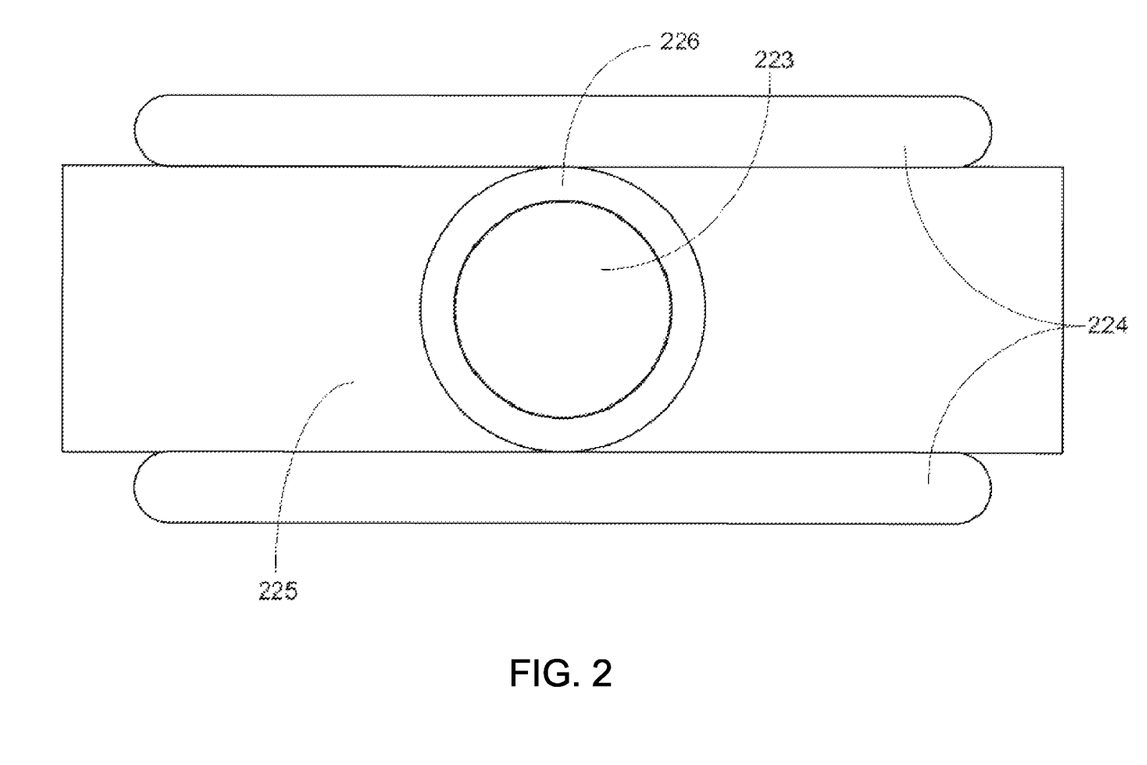
FIG. 2 is a cross-sectional view of a portion of the dielectric electrode assembly of FIG. 1.

Referring now to FIG. 2, therein is shown a cross-sectional view of a portion of the dielectric electrode assembly of FIG. 1. Visible in this cross-section are metal electrodes 224 surrounding a structural dielectric 225 with a dielectric tube 226 embedded in the structural dielectric 225. The dielectric tube 226 is shown as in direct contact with the metal electrodes 224, but it is understood that this is for illustrative purposes only. The structural dielectric 225 could be between the dielectric tube 226 and the metal electrodes 224 in an alternate embodiment. As used herein, a uniform electric field may refer to an electric field that has the same electric field intensity (both in terms of magnitude and direction) at any two points within the electric field. Electric fields may have varying degrees of uniformity, for example, an electric field that is 95% uniform may have the same electric field intensity throughout 95% of the volume of space in which the electric field exists.

Electric field uniformity may be measured as described herein. In various examples, any finite element analysis (FEA) software capable of simulating electrostatic fields may be used in accordance with the following techniques. For example, COMSOL Multiphysics may be used to determine the uniformity of an electrostatic field inside a region of interest (ROI). In various examples, it is important to pick an element size that can accurately take into account boundary transitions and fringe effects. Additionally, for the following methods, it is assumed that the length of the electrode is long enough that most of the electric field inside of the gain medium can be considered to be unchanged along the bore axis (e.g., inside the laser gas channel). A two dimensional model of the electrode assembly and the laser gas channel (e.g., the ceramic tube) may be created in the FEA simulation software. The appropriate dielectric properties may be input in the FEA simulation software for the different regions of the assembly, as described in further detail below. Voltage potentials are applied at the appropriate locations in the simulation. The FEA simulation software may then calculate the electric field inside the laser gas discharge bore (e.g., inside the ceramic tube or other laser gas channel).

The magnitude of the electric field in the X and Y axis (with the Z axis being along the laser gas channel) is calculated for each data point. The maximum value of the magnitude of the electric field from this data set is determined. The data set is divided by the maximum value (e.g., the data set is normalized). The minimum value of the normalized data set is the uniformity. For example, if the lowest value is 50% of the maximum value, the uniformity of the electric field in the discharge region can be considered to be 50%. The electric discharge happens at the highest points. Having large differences in magnitude in the laser gas discharge region causes a non-uniform discharge. Accordingly, it is beneficial to maximize the uniformity of the electric field within the laser gas discharge region (e.g., within the laser gas channel).

The metal electrodes 224 may have electrode profiles which are parallel and flat at the top and bottom of the metal electrodes 224. In order for the metal electrodes 224 to be parallel and flat at their top and bottom surfaces, and still generate a relatively uniform electric field (e.g. an electric field with a uniformity of at least 90% within the optical mode cross section 223 of the dielectric tube 226), the structural dielectric 225 may have a relative dielectric constant. $\varepsilon_3$. The structural dielectric 225 can surround the dielectric tube 226, which is located between the metal electrodes 224. The dielectric tube 226 is formed from a dielectric material of a relative dielectric constant, $\varepsilon_2$. A laser gas is contained inside the dielectric tube 226 and has a relative dielectric constant, $\varepsilon_1$. Because the metal electrodes 224 are parallel and flat, the interior region of the dielectric tube 226 may match the optical mode cross-section 223, which is circular in this example. The dielectric tube 226 has an inside radius ($R_1$) and an outside radius ($R_2$). The inside radius may be defined as the distance between the center of the dielectric tube 226 to the inside wall of the dielectric tube 226. The outside radius may be defined as the distance between the center of the dielectric tube 226 and the outer edge of the dielectric tube 226. Both the inside radius and the outside radius are with respect to the cross-sectional view.

To use the metal electrodes 224 having flat geometry (that is, flat at the top and bottom of each of the metal electrodes 224) when the dielectric tube 226 has cylindrical cross-sectional geometry and still be able to generate a uniform electric field when voltage is applied between the metal electrodes 224, the structural dielectric 225 may have a relative dielectric constant, $\varepsilon_3$, of a value given by Equation 1 (also known as a cylindrical tube assembly equation) below for the cylindrical case:

$$\varepsilon_3 \approx \varepsilon_2 \left[ \frac{R_1^2(\varepsilon_1 - \varepsilon_2) + R_2^2(\varepsilon_1 + \varepsilon_2)}{R_1^2(\varepsilon_2 - \varepsilon_1) + R_2^2(\varepsilon_1 + \varepsilon_2)} \right] \quad \text{Equation 1}$$

Although generation of a uniform electric field is principally described herein, in various examples, the values of various parameters of Equation 1 (e.g., inside radius $R_1$, outside radius $R_2$, the relative dielectric constant of the structural dielectric 225 ($\varepsilon_3$), the relative dielectric constant of the dielectric tube 226 ($\varepsilon_2$), and/or the relative dielectric constant of the laser gas inside the dielectric tube 226 ($\varepsilon_1$)) may be selected such that the uniformity of the electric field generated within the optical mode cross section 223 is less than 100% uniform, but is at least 90% uniform. In such examples, the equality of Equation 1 may not hold perfectly (hence the $\approx$ symbol). In some cases, design constraints, manufacturing and/or fabrication issues (such as precision limitations and/or error), cost, and/or other factors may result in a dielectric electrode assembly design that generates an electric field with less than complete uniformity (but with a uniformity of at least 90%) when voltage is applied between the metal electrodes 224. Although such embodiments may not be as efficient as embodiments that completely satisfy the equality of Equation 1 (such that the "$\approx$" symbol could instead be replaced by an "=" symbol), such embodiments may still offer increased efficiency over previous dielectric electrode assembly designs with flat electrodes and are explicitly contemplated in the present disclosure.

It has been discovered that the use of the metal electrodes 224 having flat cross-sectional geometry combined with the dielectric tube 226 of a cylindrical cross-sectional geometry generates an electric field with a high degree of uniformity (e.g., greater than 90% uniformity) when their respective dielectric constants match up (or approximately match up) with the relative dielectric constant of the structural dielectric 225 as governed by Equation 1. When the relative dielectric constants of the metal electrodes 224, the structural dielectric 225, and the dielectric tube 226 are related to each other in the proper ratios as governed by Equation 1, a uniform electric field is generated, and no power is lost, as the electric field matches the optical mode cross-section 223, which is matched with the inside radius of the dielectric tube 226, which determines exactly where the laser gas will be. All of this together results in a laser with very high energy efficiency. Additionally, as described above, in some examples, the relative dielectric constants of the metal electrodes 224, the structural dielectric 225, and the dielectric tube 226 may be selected such that Equation 1 is substantially obeyed (e.g., such that the equality holds to within +/−0.1%, 0.2%, 0.5%, 1%, 2%, 5% or some other suitable value). In such examples, a highly uniform electric field may be generated that approximately matches the optical mode cross-section 223. Similarly, in various examples, the inside radius ($R_1$) and/or the outside radius ($R_2$) of dielectric tube 226 may be selected such that Equation 1 is substantially obeyed (e.g., such that the equality holds to within +/−0.1%, 0.2%, 0.5%, 1%, 2%, 5% or some other suitable value). In such examples, a highly uniform electric field may be generated that approximately matches the optical mode cross-section 223, In any event, values may be chosen for the relative dielectric constants and/or radii such that the uniformity of the electric field generated by the dielectric electrode assembly is greater than or equal to 90%.

For illustrative purposes, the metal electrodes 224 are shown as in direct contact with the dielectric tube 226. This configuration may provide the strongest electrical coupling between the metal electrodes 224 and the laser gas inside the dielectric tube 226, which is usually preferred. However, the present invention does not require direct contact between the metal electrodes 224 and the dielectric tube 226 and will function just as well provided the structural dielectric 225, having a relative dielectric constant value as specified by Equation 1, tills the spaces between the metal electrodes 224 and the dielectric tube 226.

It has been discovered that the proper choice of an electrode width of the metal electrodes 224 and the rounded edges of the metal electrodes 224 keeps minor electric field perturbations inside the dielectric tube 226 below detectable levels. For example, a good guideline for the electrode width is to make the width of the metal electrodes 224 at least three times the outside diameter of the dielectric tube 226. The use of rounded edges on the metal electrodes 224 also contributes to minimizing electric field perturbations inside the dielectric tube 226 and further helps to suppress corona discharges that could possibly form at very high applied voltages between the metal electrodes 224.

It has also been discovered that using materials of the proper dielectric constants for the metal electrodes 224, the structural dielectric 225, and the dielectric tube 226 at ratios governed (or approximately governed) by Equation 1 allows for simplified manufacturing of laser components and the manufacturing of energy efficient laser assemblies. Because the relationship of the relative dielectric constants match up (or approximately match up) according to Equation 1. complicated profiling of the metal electrodes 224 is unnecessary, and simple, easy to manufacture electrodes of flat geometry can be used. This reduces cost and improves manufacturing efficiency. Combined with the easy-to-manufacture cylindrical cross-section of the dielectric tube 226, a highly efficient laser can be created which allows for the generation of a highly uniform electric field (e.g., an electric field with a uniformity of at least 90%) leading to very little wasted energy while at the same time simplifying manufacture by avoiding complicated profiles for any critical component.

Figure 3:
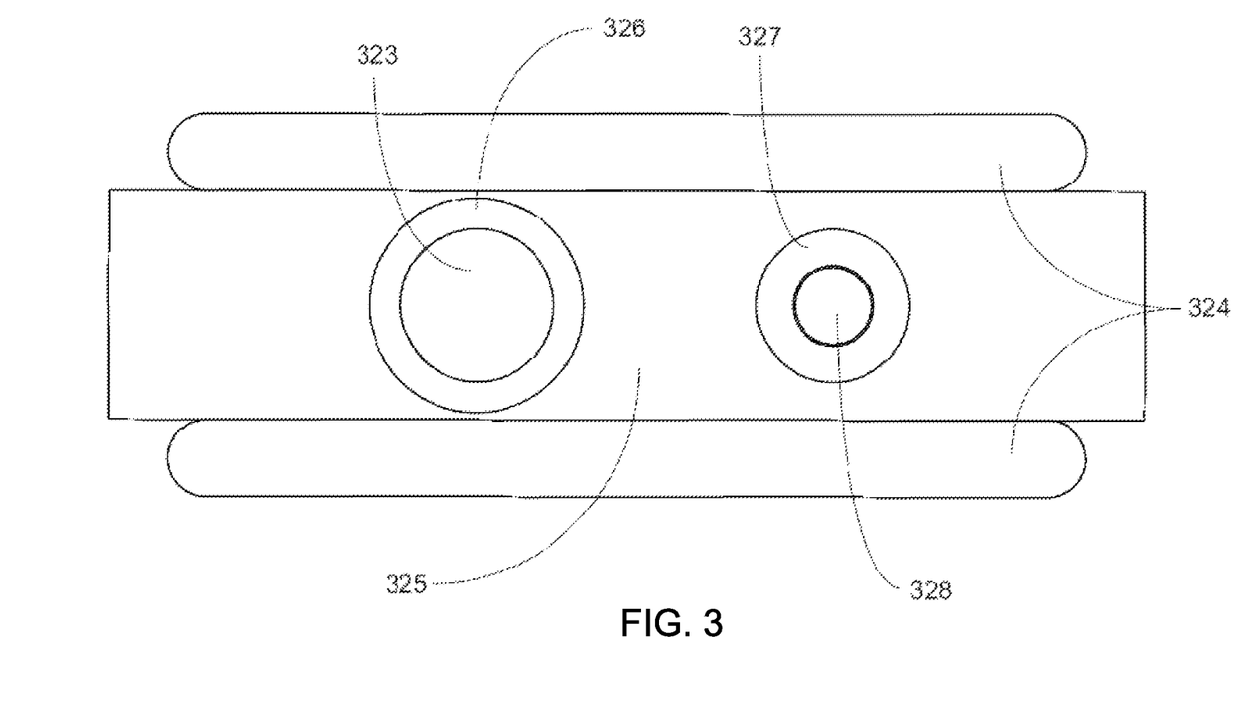
FIG. 3 is a cross-sectional view of a portion of the dielectric electrode assembly of FIG. 1 in a second embodiment of the present invention.

Referring now to FIG. 3, therein is shown a cross-sectional view of a portion of the dielectric electrode assembly of FIG. 1 in a second embodiment of the present invention. For illustrative purposes, a first dielectric tube 326 and a second dielectric tube 327 are shown, but it is understood that there is no limit on the number of tubes that can be used in one electrode assembly. The only restriction on additional dielectric tubes is that they have a combination of parameter values that yield the same (or approximately the same) value of dielectric constant, $\varepsilon_3$, as for every other dielectric tube in the assembly when using the dielectric values as given in Equation 1.

Similar to the cross-sectional view in FIG. 2, metal electrodes 324 have electrode profiles which are parallel and flat at the top and bottom of the metal electrodes 324. The metal electrodes 324 are rounded at the edges. In order for the metal electrodes 324 to be parallel and flat at their top and bottom surfaces, a structural dielectric 325 may have a relative dielectric constant, $\varepsilon_3$ in order to generate an electric field with a uniformity of at least 90% in the optical mode cross section. The structural dielectric 325 can surround the first dielectric tube 326 and the second dielectric tube 327, which are located between the metal electrodes 324.

Similar to the dielectric tube 226 of FIG. 2, the first dielectric tube 326 is formed from a dielectric material of a relative dielectric constant, $\varepsilon_2$. A laser gas is contained inside the first dielectric tube 326 and has a relative dielectric constant, $\varepsilon_1$. Because the metal electrodes 324 are parallel and flat, the interior region of the first dielectric tube 326 may be selected, so as to match an optical mode cross-section 323, which is circular in this example. The first dielectric tube 326 has an inside radius ($R_1$) and an outside radius ($R_2$). The inside radius is defined as the distance between the center of the first dielectric tube 326 to the inside wall of the first dielectric tube 326. The outside radius is defined as the distance between the center of the first dielectric tube 326 and the outer edge of the first dielectric tube 326. Both the inside radius and the outside radius are with respect to the cross-sectional view. The relative dielectric constants are in reference to Equation 1 and may be such that they can be plugged into Equation 1 to equal the relative dielectric constant, $\varepsilon_3$ of the structural dielectric 325 in order to generate a uniform electric field in the optical mode cross-section 323. However, as previously described, in some examples, various parameters of Equation 1 may be selected such that the equality of Equation 1 is only approximately true (e.g., "≈"), so long as the electric field generated by the dielectric electrode assembly is at least 90% uniform within the optical mode cross-section 323.

In a similar manner, regarding the second dielectric tube 327, the set of values for inner and outer tube radii and the relative dielectric constant values $\varepsilon_2$ and $\varepsilon_1$ for materials making up the second dielectric tube 327 and a liquid dielectric coolant 328, respectively, may be selected such that Equation 1 is at least approximately satisfied. Accordingly, Equation 1 may yield the same value (or approximately the same value) of $\varepsilon_3$ for the structural dielectric 325 as the dielectric values of the first dielectric tube 326 and the laser gas within the first dielectric tube 326. In this example, the liquid dielectric coolant 328 fills the inside of the second dielectric tube 327, but it is understood that the second dielectric tube 327 could also be filled with a laser gas in the same manner as the first dielectric tube 326.

With both dielectric tubes and their respective laser gases or dielectric coolants equating to the same (or approximately the same) relative dielectric constant, $\varepsilon_3$ of the structural dielectric 325, an electric field with at least 90% uniformity may exist inside the first dielectric tube 326 and the second dielectric tube 327 regardless of their relative position to each other. Thus, the presence of the second dielectric tube 327 and the liquid dielectric coolant 328 may not distort the electric field within the first dielectric tube 326. For illustrative purposes, the first dielectric tube 326 and the second dielectric tube 327 are spaced away from each other, but in the example where both use materials with relative dielectric constant values which end up with the same value of $\varepsilon_3$ for the structural dielectric 325 when using Equation 1, the first dielectric tube 326 and the second dielectric tube 327 can be in direct contact with no change in the uniformity of the electric fields within the respective tubes. This may hold true regardless of how many tubes are within the structural dielectric and regardless of contact, or lack thereof, between the tubes, so long as the tubes are surrounded by the same structural dielectric.

It has been discovered that the proper choice of an electrode width of the metal electrodes 324 and the rounded edges of the metal electrodes 324 keeps minor electric field perturbations inside the first dielectric tube 326 or the second dielectric tube 327 below detectable levels. For example, a good guideline for the electrode width is to make the width of the metal electrodes 324 at least one tube diameter beyond the edge of the outermost dielectric tube, no matter how many dielectric tubes are present. The use of rounded edges on the metal electrodes 324 may also contribute to minimizing electric field perturbations inside the dielectric tubes and further helps to suppress corona discharges that could possibly form at very high applied voltages between the metal electrodes 324.

Figure 4:
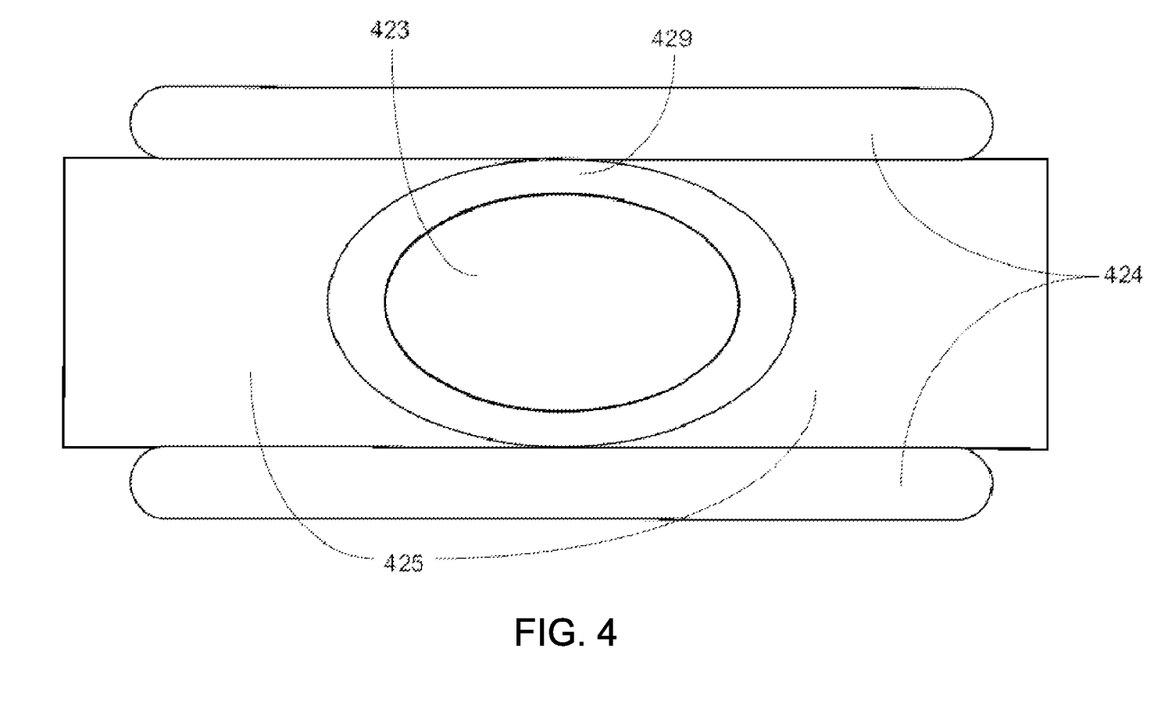
FIG. 4 is a cross-sectional view of a portion of the dielectric electrode assembly of FIG. 1 in a third embodiment of the present invention.

Referring now to FIG. 4, therein is shown a cross-sectional view of a portion of the dielectric electrode assembly of FIG. 1 in a third embodiment of the present invention. Visible in this cross-section are metal electrodes 424 surrounding a structural dielectric 425 with a dielectric tube 429 embedded in the structural dielectric 425. The dielectric tube 429 is shown as in direct contact with the metal electrodes 424, but it is understood that this is for illustrative purposes only. The structural dielectric 425 could be between the dielectric tube 429 and the metal electrodes 424 in an alternate embodiment.

The metal electrodes 424 have electrode profiles which are parallel and flat at the top and bottom of the metal electrodes 424. In order for the metal electrodes 424 to be parallel and flat at their top and bottom surfaces, and still generate a uniform electric field, the structural dielectric 425 may have a relative dielectric constant, $\varepsilon_3$. The structural dielectric 425 can surround the dielectric tube 429, which is located between the metal electrodes 424. The dielectric tube 429 is formed from a dielectric material of a relative dielectric constant, $\varepsilon_2$. A laser gas is contained inside the dielectric tube 429 and may have a relative dielectric constant, $\varepsilon_1$. Because the metal electrodes 424 are parallel and flat, the interior region of the dielectric tube 429 may match or approximately match an optical mode cross-section 423, which is elliptical in this example.

The dielectric tube 429 in this example has elliptic cross-sectional geometry. The cross-sections of the inner and outer elliptic surfaces of the dielectric tube 429 are ellipses having common foci. The elliptic cross-section of the interior surface of the dielectric tube 429 has semi-major axis dimension, $A_1$ and semi-minor axis dimension, $B_1$. The elliptic cross-section of the exterior surface of the dielectric tube 429 has semi-major axis dimension, $A_2$ and semi-minor axis dimension, $B_2$. The common foci of the interior and exterior elliptic cross-sections are located at ±a as given by either of the following equations:

$$\alpha = \pm\sqrt{A_1^2 - B_1^2} \quad \text{Equation 2}$$

or $$\alpha = \pm\sqrt{A_2^2 - B_2^2} \quad \text{Equation 3}$$

As in the case of the dielectric tube 226 of FIG. 2 having cylindrical cross-sectional geometry, the region inside the dielectric tube 429 having elliptical cross-sectional geometry may contain a uniform electric field when a voltage is applied between the metal electrodes 424 which are parallel and flat on the top and bottom surfaces. Furthermore, the interior region of the dielectric tube 429 may also match or approximately match the optical mode cross-section 423, which is elliptical in this example. To use parallel electrodes of flat geometry when the dielectric tube 429 has elliptical cross-sectional geometry, the structural dielectric 425 must have a dielectric constant, $\varepsilon_3$, of value given by Equation 4 (also known as an elliptical tube assembly equation) below for the elliptic case:

$$\varepsilon_3 \approx \varepsilon_2 \frac{B_2}{A_2}\left[\frac{(A_2A_1^2 - A_1B_1B_2)\varepsilon_1 + (A_1B_1B_2 - A_2B_1^2)\varepsilon_2}{(B_2A_1^2 - A_1B_1A_2)\varepsilon_1 + (A_1B_1A_2 - B_2B_1^2)\varepsilon_2}\right] \quad \text{Equation 4}$$

In various examples, the values of various parameters of Equation 4 (e.g., semi-major axis dimension, $A_1$, semi-minor axis dimension, $B_1$, semi-major axis dimension, $A_2$ and semi-minor axis dimension, $B_2$, the relative dielectric constant of the structural dielectric 225 ($\varepsilon_3$), the relative dielectric constant of the dielectric tube 226 ($\varepsilon_2$), and/or the relative dielectric constant of the material inside the tube 226 ($\varepsilon_1$)) may be selected such that the uniformity of the electric field generated within the optical anode cross section 423 is less than 100% uniform, but is at least 90% uniform. In such examples, the selected values may not completely conform with the values that are expected according to Equation 4 (hence the ≈ symbol). However, so long as the electric field generated by the dielectric electrode assembly is at least 90% uniform, the dielectric electrode assembly may provide an acceptable level of efficiency, depending on the desired implementation. However, in some cases, design constraints, manufacturing and/or fabrication issues (such as precision limitations and/or error), cost, and/or other factors may result in a dielectric electrode assembly design that generates an electric field with less than complete uniformity (but with a uniformity of at least 90%) when voltage is applied between the metal electrodes 424. Although such embodiments may not be as efficient as embodiments that satisfy the equality of Equation 4, such embodiments may still offer increased efficiency over previous dielectric electrode assembly designs with flat electrodes and are explicitly contemplated in the present disclosure.

As in the case of the dielectric tube 226, it should be noted that the metal electrodes 424 as depicted by FIG. 4 show the metal electrodes 424 in contact with the dielectric tube 429. Having the metal electrodes 424 in contact with the dielectric tube 429 provides the strongest electrical coupling between the metal electrodes 424 and the gas inside the dielectric tube 429. However, the present invention does not require contact between the metal electrodes 424 and the dielectric tube 429 and may function just as well provided the structural dielectric 425 has a relative dielectric constant value as specified by Equation 4, and fills the spaces between the metal electrodes 424 and the dielectric tube 429. Furthermore, it should be noted for the case of the dielectric tube 429 having an elliptical cross-sectional geometry, the metal electrodes 424 may be flat and parallel to each other, but not necessarily parallel to either the major axis or minor axis of the elliptic cross-section of the dielectric tube 429. The electric field inside the dielectric tube 429 may be uniform (or at least 90% uniform) regardless of the orientation of the metal electrodes 424 so long as they are flat and parallel and the relative dielectric constant of the structural dielectric 425 matches up with (or approximately matches up with) the value produced by Equation 4.

It has been discovered that using materials of the proper dielectric constants for the metal electrodes 424, the structural dielectric 425, and the dielectric tube 429 at ratios governed by Equation 4 allows for simplified manufacturing of laser components and the manufacturing of energy efficient laser assemblies. Because the relationship of the relative dielectric constants match up (or approximately match up) according to Equation 4, complicated profiling of the metal electrodes 424 is unnecessary, and simple, easy to manufacture electrodes of flat geometry can be used. This reduces cost and improves manufacturing efficiency. Combined with the easy-to-manufacture elliptical cross-section of the dielectric tube 429, a highly efficient laser can be created which allows for the generation of a uniform electric field leading to very little wasted energy while at the same time simplifying manufacture by avoiding complicated profiles for any critical component.

Figure 5:
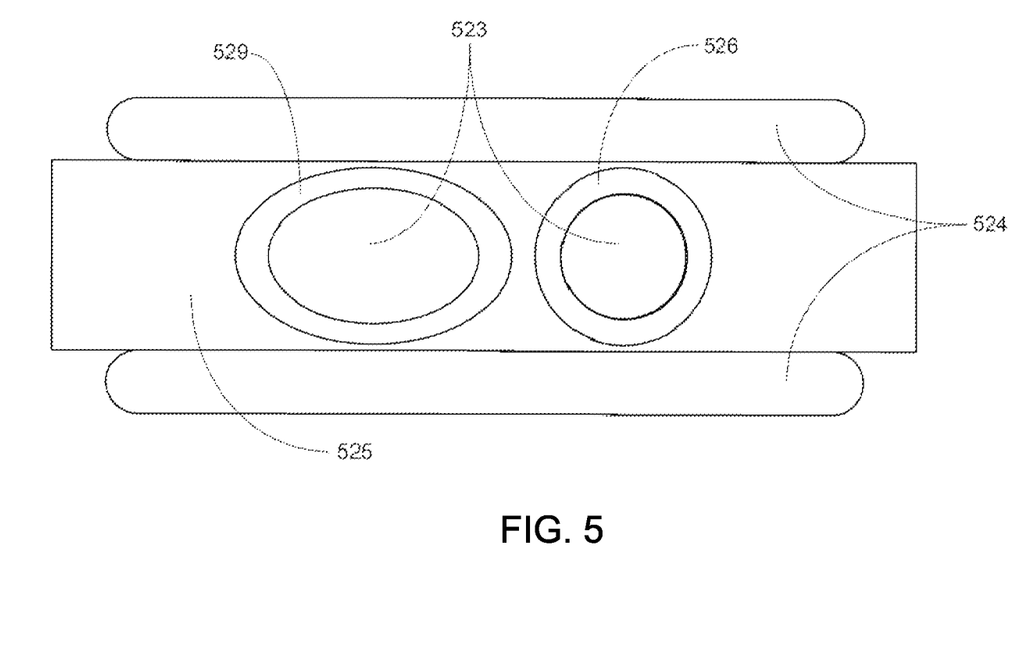
FIG. 5 is a cross-sectional view of a portion of the dielectric electrode assembly of FIG. 1 in a fourth embodiment of the present invention.

Referring now to FIG. 5, therein is shown a cross-sectional view of a portion of the dielectric electrode assembly of FIG. 1 in a fourth embodiment of the present invention. Similar to the cross-sectional view in FIG. 2, metal electrodes 524 have electrode profiles which are parallel and flat at the top and bottom of the metal electrodes 524. The metal electrodes 524 are rounded at the edges. In order for the metal electrodes 524 to be parallel and flat at their top and bottom surfaces, a structural dielectric 525 between the metal electrodes 524 may have a relative dielectric constant, $\varepsilon_3$. The structural dielectric 525 can surround a first dielectric tube 526 and a second dielectric tube 529, which are located between the metal electrodes 524.

For illustrative purposes, only the first dielectric tube 526 and the second dielectric tube 529 are shown, but it is understood that there is no limit on the number of tubes that can be used in one electrode assembly. The only restriction on additional dielectric tubes is that they have a combination of parameter values that yield the same value (or approximately same value) of dielectric constant, $\varepsilon_3$, for the structural dielectric 525 as for every other dielectric tube in the assembly, similar to FIG. 3. Unlike FIG. 3, however, different equations are used to calculate the proper parameter values to reach the same value of dielectric constant, $\varepsilon_3$, for the structural dielectric 525 surrounding dielectric tubes having cylindrical cross-sections and for dielectric tubes having elliptical cross-sections. In this example, the first dielectric tube 526 has a cylindrical cross-section, and has a relative dielectric constant, $\varepsilon_2$, and is filled with a laser gas or dielectric coolant having a relative dielectric constant, which may be used to reach dielectric constant, $\varepsilon_3$, of the structural dielectric 525 when using Equation 1. Additionally, the second dielectric tube 529 has an elliptical cross-section in this example, and has a relative dielectric constant, $\varepsilon_2$, and is filled with a laser gas having a relative dielectric constant, $\varepsilon_1$, which may be used to reach dielectric constant, $\varepsilon_3$, of the structural dielectric 525 when using Equation 4.

In greater detail, because the metal electrodes 524 are parallel and flat, the interior region of the first dielectric tube 526 is also a match or approximate match to an optical mode cross-section 523, which is circular inside the first dielectric tube 526. The first dielectric tube 526 has an inside radius ($R_1$) and an outside radius ($R_2$). The inside radius is defined as the distance between the center of the first dielectric tube 526 to the inside wall of the first dielectric tube 526. The outside radius is defined as the distance between the center of the first dielectric tube 526 and the outer edge of the first dielectric tube 526. Both the inside radius and the outside radius are with respect to the cross-sectional view. The relative dielectric constants are in reference to Equation 1 such that they can be plugged into Equation 1 to equal (or approximately equal) the relative dielectric constant, $\varepsilon_3$ of the structural dielectric 525.

The second dielectric tube 529 in this example has elliptic cross-sectional geometry. The cross-sections of the inner and outer elliptic surfaces of the second dielectric tube 529 are ellipses having common foci. The elliptic cross-section of the interior surface of the second dielectric tube 529 has semi-major axis dimension, $A_1$ and semi-minor axis dimension. The elliptic cross-section of the exterior surface of the second dielectric tube 529 has semi-major axis dimension, $A_2$ and semi-minor axis dimension, $B_2$. The common foci of the interior and exterior elliptic cross-sections are located at $\pm a$ as given by Equation 2 and Equation 3.

As in the case of the first dielectric tube 526 having cylindrical cross-sectional geometry, the region inside the second dielectric tube 529 having elliptical cross-sectional geometry may contain an electric field that is at least 90% uniform within the optical mode cross-section 523 when a voltage is applied between the metal electrodes 524 which are parallel and flat on the top and bottom surfaces and all parameters match up (or approximately match up) according to Equation 4. Furthermore, the interior region of the second dielectric tube 529 may also match (or approximately match) the optical mode cross-section 523, which is elliptical inside the second dielectric tube 529. To use parallel electrodes of flat geometry when the second dielectric tube 529 has elliptical cross-sectional geometry, the structural dielectric 525 may have a dielectric constant, $\varepsilon_3$, of value given by Equation 4 (or a value that approximates the value given by Equation 4), as described above.

Equation 4 assumes the relative dielectric constant of the material inside the tube is approximately equal to 1 as would be the case for a gas laser. Furthermore, it should be noted for the case of the second dielectric tube 529 having an elliptical cross-sectional geometry, the metal electrodes 524 may be flat and parallel to each other, but not necessarily parallel to either the major axis or minor axis of the elliptic cross-section of the second dielectric tube 529. The electric field inside the second dielectric tube 529 may be uniform regardless of the orientation of the metal electrodes 524 so long as they are flat and parallel and the relative dielectric constant of the structural dielectric 525 matches up with (or approximately matches up with) the value produced by Equation 4. In other words, the second dielectric tube 529, in spite of having an elliptical cross-section, may be placed in any rotational orientation without affecting the efficiency of the laser or interfering with the uniformity of the electric field inside the second dielectric tube 529.

It has been discovered that the proper choice of an electrode width of the metal electrodes 524 and the rounded edges of the metal electrodes 524 keeps minor electric field perturbations inside the first dielectric tube 526 or the second dielectric tube 529 below detectable levels. For example, a good guideline for the electrode width is to make the width of the metal electrodes 524 at least one tube diameter beyond the edge of the outermost dielectric tube, no matter how many dielectric tubes are present. The use of rounded edges on the metal electrodes 524 also contributes to minimizing electric field perturbations inside the dielectric tubes and further helps to suppress corona discharges that could possibly form at very high applied voltages between the metal electrodes 524.

It has been discovered that using materials of the proper dielectric constants for the metal electrodes 524, the structural dielectric 525, the first dielectric tube 526, and the second dielectric tube 529, at ratios governed by (or approximately governed by) either Equation 1 or Equation 4, as appropriate, allows for simplified manufacturing of laser components and the manufacturing of energy efficient dielectric electrode assemblies. Because the relationship of the relative dielectric constants match up (or approximately match up) according to Equation 1 or Equation 4, complicated profiling of the metal electrodes 524 is unnecessary, and simple, easy to manufacture electrodes of flat geometry can be used. This reduces cost and improves manufacturing efficiency. Combined with the easy-to-manufacture cylindrical and elliptical cross-sections of the first dielectric tube 526 and the second dielectric tube 529, respectively, a highly efficient laser can be created which allows for the generation of an electric field with at least 90% uniformity, leading to very little wasted energy while at the same time simplifying manufacture by avoiding complicated profiles for any critical component.

Figure 6:
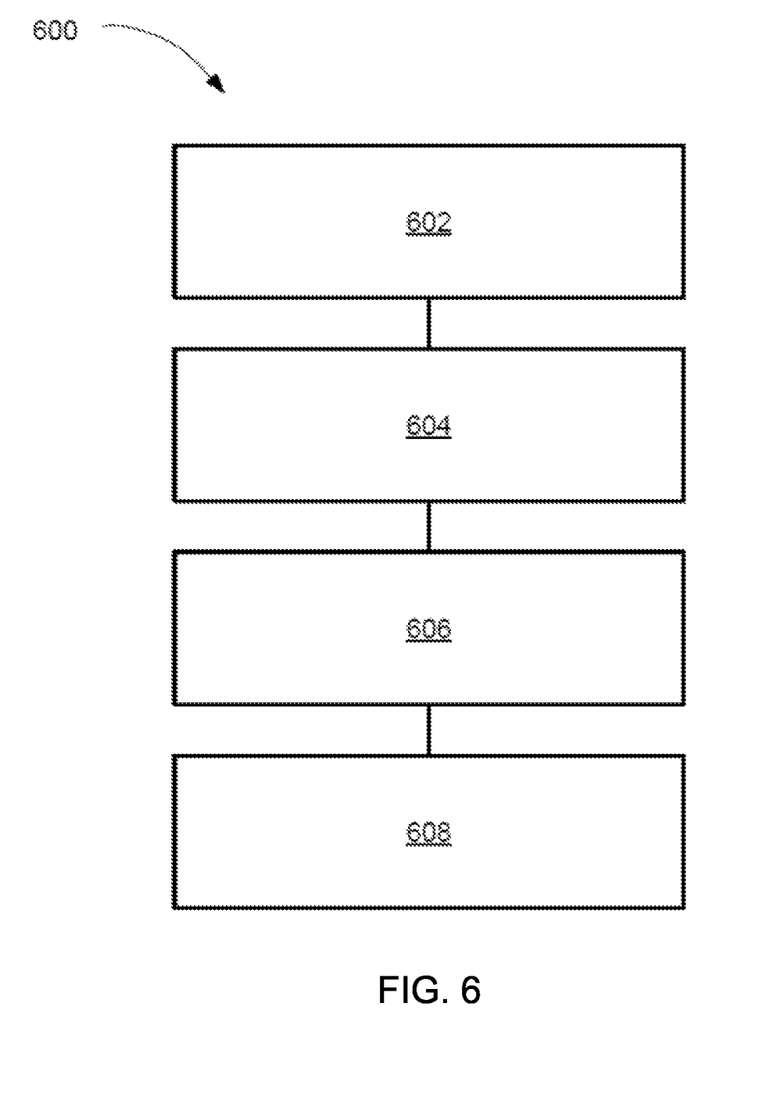
FIG. 6 is a flow chart of a method of manufacture of a dielectric electrode assembly in a further embodiment of the present invention.

Referring now to FIG. 6, therein is shown a flow chart of a method 600 of manufacture of a dielectric electrode assembly in a further embodiment of the present invention. The method 600 includes: providing a dielectric tube having a cylindrical cross-section and a relative dielectric constant, $\varepsilon_2$, the dielectric tube filled with a gas having a relative dielectric constant, $\varepsilon_1$ in a block 602; surrounding the dielectric tube with a structural dielectric having a relative dielectric constant, $\varepsilon_3$ in a block 604; positioning metal electrodes on opposite sides of the structural dielectric, the metal electrodes having a flat cross-sectional geometry in a block 606; and selecting a material for the structural dielectric such that the relative dielectric constants of the structural dielectric, the dielectric tube, and the gas are interrelated and an electric field of at least 90% uniformity is generated within the dielectric tube when power is applied to the metal electrodes in a block 608.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing dielectric electrode assemblies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a dielectric electrode assembly comprising:
   providing a dielectric tube having a cylindrical cross-section and a relative dielectric constant, $\varepsilon_2$, the dielectric tube filled with a gas having a relative dielectric constant, $\varepsilon_1$;
   surrounding the dielectric tube with a structural dielectric having a relative dielectric constant, $\varepsilon_3$;
   positioning metal electrodes on opposite sides of the structural dielectric, the metal electrodes having a flat cross-sectional geometry; and
   selecting a material for the structural dielectric such that the relative dielectric constants of the structural dielectric, the dielectric tube, and the gas are interrelated and an electric field of at least 90% uniformity is generated within the dielectric tube when power is applied to the metal electrodes.

2. The method as claimed in claim 1 wherein selecting the material for the structural dielectric includes:
   selecting $R_1$ as an inside radius of the dielectric tube and $R_2$ is an outside radius of the dielectric tube; and
   selecting the material for the structural dielectric and the dielectric tube such that the relative dielectric constants are related by a cylindrical tube assembly equation of:

$$\varepsilon_3 \approx \varepsilon_2 \left[ \frac{R_1^2(\varepsilon_1 - \varepsilon_2) + R_2^2(\varepsilon_1 + \varepsilon_2)}{R_1^2(\varepsilon_2 - \varepsilon_1) + R_2^2(\varepsilon_1 + \varepsilon_2)} \right]$$

such that the electric field of at least 90% uniformity is generated.

3. The method as claimed in claim 1 wherein positioning the metal electrodes includes positioning the metal electrodes having an electrode width at least one dielectric tube diameter past an edge of the dielectric tube on the structural dielectric.

4. The method as claimed in claim 1 wherein positioning the metal electrodes includes positioning the metal electrodes in direct contact with the dielectric tube.

5. The method as claimed in claim 1 wherein positioning the metal electrodes includes positioning the metal electrodes on the structural dielectric and spaced away from the dielectric tube.

6. A method of manufacture of a dielectric electrode assembly comprising:
   providing a dielectric tube having an elliptical cross-section and a relative dielectric constant, $\varepsilon_2$, the dielectric tube filled with a gas having a relative dielectric constant, $\varepsilon_1$;
   surrounding the dielectric tube with a structural dielectric having a relative dielectric constant, $\varepsilon_3$;
   positioning metal electrodes on opposite sides of the structural dielectric, the metal electrodes having a flat cross-sectional geometry; and
   selecting a material for the structural dielectric such that the relative dielectric constants of the structural dielectric, the dielectric tube, and the gas are interrelated and an electric field of at least 90% uniformity is generated within the dielectric tube when power is applied to the metal electrodes.

7. The method as claimed in claim 6 wherein selecting the material for the structural dielectric includes:
   selecting an interior surface of the dielectric tube comprising a semi-major axis dimension, $A_1$ and semi-minor axis dimension, $B_1$;
   selecting an exterior surface of the dielectric tube comprising a semi-major axis dimension, $A_2$ and semi-minor axis dimension, $B_2$;
   selecting the gas with a relative dielectric constant $\varepsilon_1$; and
   selecting the gas and the material for the structural dielectric and the dielectric tube such that the relative dielectric constants are related by an elliptical tube assembly equation of:

$$\varepsilon_3 \approx \varepsilon_2 \frac{B_2}{A_2} \left[ \frac{(A_2 A_1^2 - A_1 B_1 B_2)\varepsilon_1 + (A_1 B_1 B_2 - A_2 B_1^2)\varepsilon_2}{(B_2 A_1^2 - A_1 B_1 A_2)\varepsilon_1 + (A_1 B_1 A_2 - B_2 B_1^2)\varepsilon_2} \right].$$

8. The method as claimed in claim 7 further comprising:
providing another dielectric tube having a cylindrical cross-section and a relative dielectric constant, $\varepsilon_2$, the another dielectric tube filled with another gas having a relative dielectric constant, $\varepsilon_1$; and
selecting a second material for the another dielectric tube, where $R_1$ is an inside radius of the another dielectric tube and $R_2$ is an outside radius of the another dielectric tube, such that the relative dielectric constant of the another dielectric tube and the gas are determined by a cylindrical tube assembly equation wherein the relative dielectric constant of the structural dielectric matches with a result of the elliptical tube assembly equation, and the cylindrical tube assembly equation is:

$$\varepsilon_3 \approx \varepsilon_2 \left[ \frac{R_1^2(\varepsilon_1 - \varepsilon_2) + R_2^2(\varepsilon_1 + \varepsilon_2)}{R_1^2(\varepsilon_2 - \varepsilon_1) + R_2^2(\varepsilon_1 + \varepsilon_2)} \right].$$

9. The method as claimed in claim 6 wherein positioning the metal electrodes includes positioning the metal electrodes in direct contact with the dielectric tube.

10. The method as claimed in claim 6 wherein positioning the metal electrodes includes positioning the metal electrodes on the structural dielectric and spaced away from the dielectric tube.

11. A dielectric electrode assembly comprising:
a dielectric tube having a cylindrical cross-section and a relative dielectric constant, $\varepsilon_2$, the dielectric tube filled with a gas having a relative dielectric constant, $\varepsilon_1$;
a structural dielectric having a relative dielectric constant, $\varepsilon_3$, surrounding the dielectric tube;
metal electrodes on opposite sides of the structural dielectric, the metal electrodes having a flat cross-sectional geometry; and
the structural dielectric made from a material selected such that the relative dielectric constants of the structural dielectric, the dielectric tube, and the gas are interrelated and an electric field of at least 90% uniformity is generated within the dielectric tube when power is applied to the metal electrodes.

12. The dielectric electrode assembly of claim 11 wherein:
$R_1$ is an inside radius of the dielectric tube and $R_2$ is an outside radius of the dielectric tube; and
the material for the structural dielectric is selected such that the relative dielectric constants of the structural dielectric, the dielectric tube, and the gas are related by a cylindrical tube assembly equation of:

$$\varepsilon_3 \approx \varepsilon_2 \left[ \frac{R_1^2(\varepsilon_1 - \varepsilon_2) + R_2^2(\varepsilon_1 + \varepsilon_2)}{R_1^2(\varepsilon_2 - \varepsilon_1) + R_2^2(\varepsilon_1 + \varepsilon_2)} \right].$$

13. The dielectric electrode assembly of claim 11 wherein the metal electrodes have an electrode width of at least one dielectric tube diameter past an edge of the dielectric tube and the metal electrodes are on the structural dielectric.

14. The dielectric electrode assembly of claim 11 wherein the metal electrodes are in direct contact with the dielectric tube.

15. The dielectric electrode assembly of claim 11 wherein the metal electrodes are on the structural dielectric and spaced away from the dielectric tube.

16. The dielectric electrode assembly of claim 11 further comprising:
another dielectric tube within the structural dielectric, the another dielectric tube having an elliptical cross-section and a second relative dielectric constant, $\varepsilon_2$, the dielectric tube filled with a gas having a second relative dielectric constant, $\varepsilon_1$;
wherein:
an interior surface of the dielectric tube has semi-major axis dimension, $A_1$ and semi-minor axis dimension, $B_1$;
an exterior surface of the dielectric tube has semi-major axis dimension, $A_2$ and semi-minor axis dimension, $B_2$; and
the gas and the material for the structural dielectric and the dielectric tube are selected such that the relative dielectric constants are related by an elliptical tube assembly equation of:

$$\varepsilon_3 \approx \varepsilon_2 \frac{B_2}{A_2} \left[ \frac{(A_2 A_1^2 - A_1 B_1 B_2)\varepsilon_1 + (A_1 B_1 B_2 - A_2 B_1^2)\varepsilon_2}{(B_2 A_1^2 - A_1 B_1 A_2)\varepsilon_1 + (A_1 B_1 A_2 - B_2 B_1^2)\varepsilon_2} \right].$$

17. The dielectric electrode assembly of claim 16 wherein the metal electrodes are in direct contact with the another dielectric tube.

18. The dielectric electrode assembly of claim 16 wherein the metal electrodes are on the structural dielectric and spaced away from the another dielectric tube.

19. The dielectric electrode assembly of claim 16 wherein the metal electrodes have rounded edges.

20. The dielectric electrode assembly of claim 16 wherein the metal electrodes are parallel to each other at opposite sides of the structural dielectric.

* * * * *